US007449972B2

(12) United States Patent
Juang et al.

(10) Patent No.: US 7,449,972 B2
(45) Date of Patent: Nov. 11, 2008

(54) VOLTAGE CONTROLLED OSCILLATOR WITH ANTI SUPPLY VOLTAGE VARIATION AND/OR PROCESS VARIATION

(75) Inventors: Kai-Cheung Juang, Hsinchu (TW); Horng-Yuan Shih, Hsinchu (TW); Peng-Un Su, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/183,901

(22) Filed: Jul. 19, 2005

(65) Prior Publication Data
US 2006/0158271 A1  Jul. 20, 2006

(30) Foreign Application Priority Data
Jan. 14, 2005  (TW) .............................. 94101221 A

(51) Int. Cl.
*H03L 5/00*  (2006.01)
(52) U.S. Cl. ....................................... 331/182; 331/185
(58) Field of Classification Search ................. 331/182, 331/185
See application file for complete search history.

(56) References Cited
U.S. PATENT DOCUMENTS 3,599,119 A * 8/1971 Crouse et al. ........... 331/116 M
6,278,338 B1 * 8/2001 Jansson ................. 331/116 FE
6,653,908 B1 * 11/2003 Jones ......................... 331/183
6,700,450 B2    3/2004 Rogers
6,825,736 B1 * 11/2004 Kehler et al. ................. 331/183
7,026,883 B2 * 4/2006 Muthali et al. ............... 331/183
7,098,753 B1 * 8/2006 Dumitrescu et al. ......... 331/182
2003/0025566 A1 * 2/2003 Rogers ........................ 331/109
2006/0152295 A1 * 7/2006 Miyashita et al. ........... 331/185

* cited by examiner

*Primary Examiner*—Joseph Chang
(74) *Attorney, Agent, or Firm*—Rabin & Berdo, P.C.

(57) ABSTRACT

A voltage controlled oscillator with anti supply voltage variation and/or process variation includes an oscillation circuit for outputting an oscillatory signal; a current source coupled to the oscillation circuit for providing an input current to the oscillation circuit; and a variation compensation circuit for compensating the variations generated by the supply voltage and process. The variation compensation circuit includes a peak detector for generating a peak voltage proportional to the amplitude of the oscillatory signal; a compensating voltage generator for generating a reference voltage according to the process variation so that the oscillation circuit achieves the same working conditions under the process variation; and a comparator for comparing the peak voltage and the reference voltage to generate a control voltage. When the variation compensation circuit includes an amplifier, the supply voltage can be compensated.

8 Claims, 2 Drawing Sheets

VOLTAGE CONTROLLED OSCILLATOR WITH ANTI SUPPLY VOLTAGE VARIATION AND/OR PROCESS VARIATION

This application claims the benefit of Taiwan Patent Application No. 94101221, filed on Jan. 14, 2005, which is hereby incorporated by reference for all purposes as if fully set forth herein.

BACKGROUND OF THE INVENTION

1. Field of Invention

The invention relates to a control circuit with anti variations and, in particular, to a control circuit with anti supply voltage and process variations used in the voltage controlled oscillator of electronic circuits and communication systems.

2. Related Art

The voltage controlled oscillator is an important element in a communication system to generate a precise and stable local oscillatory signal for the system to rise, lower, modulate, and demodulate the frequency of a signal. The communication system is evolving toward higher integrity to minimize the system volume and reduce the production cost. Therefore, the voltage controlled oscillator is often integrated with other circuits on a silicon chip.

The local oscillatory signal generated by the voltage controlled oscillator determines the communication quality of the system. When the voltage controlled oscillator is operating with other circuits, the noises at the power supply terminal will enter the voltage controlled oscillator and result in a phase noise, reducing the communication quality of the system. For example, at the receiving terminal of the communication system, an interference signal in the vicinity of the receiving signal will leak into the signal band during the process of lowering and demodulating the frequency at the receiving system. The DC power provided by the battery reduces due to the battery discharge. Solutions in the prior art often employ a voltage stabilizer along with the voltage controlled oscillator to ensure the normal functioning of the voltage controlled oscillator when the power varies.

On the other hand, the output amplitude of the voltage controlled oscillator varies with the semiconductor process and temperature variations. This phenomenon will affect the operating quality of the communication system. To solve this problem, early technologies amplify the working current to reduce the variations caused by the process and temperature. However, the yield is still limited.

Another method is to use an amplitude control circuit in the voltage controlled oscillator. For example, the voltage oscillator with an amplitude controlled circuit, as disclosed in the U.S. Pat. No. 6,700,450, detects the output amplitude of the voltage controlled oscillator using a peak detector. A voltage signal proportional to the output amplitude is generated to be compared with a reference voltage by a comparator. The comparison result is converted into a current signal to control the current of the voltage controlled oscillator. At the initial state, the voltage detected by the peak detector is lower than the reference signal. After the comparison of the comparator, a current signal is generated to increase the current of the voltage controlled oscillator, enhancing the gain of the transistor in the voltage controlled oscillator. The output amplitude of the voltage controlled oscillator is thus enlarged. When the voltage detected by the peak detector is the same as the reference voltage, the voltage output by the comparator is fixed and the current of the voltage controlled oscillator is also fixed. In this case, the output amplitude of the voltage controlled oscillator reaches a stable value. This amplitude control circuit makes it possible for the output amplitude of the voltage controlled oscillator to be invariant under the semiconductor process and temperature variations.

In the prior art, the supply-voltage stabilization circuit and the amplitude control circuit are independent control circuits. A possible problem, however, is that the common-mode voltage of the voltage controlled oscillator changes when the amplitude control circuit is functioning, interfering and affecting the stability of the supply-voltage stabilization circuit. Although the voltage controlled oscillator in the amplitude control circuit can control its output amplitude within a fixed magnitude, the optimal phase noise condition originally set for the voltage controlled oscillator already changes with the amplitude control. Therefore, the combination of the control circuit and the voltage controlled oscillator increases the complexity of the circuit. The more elements there are, the more noise there is. This is against the design principle of the voltage controlled oscillator, deteriorating the phase noise of the voltage controlled oscillator.

SUMMARY OF THE INVENTION

In view of the foregoing, an objective of the invention is to provide a voltage controlled oscillator with anti supply voltage variation and/or process variation to solve the existing problems.

The characteristics and advantages of the disclosed voltage controlled oscillator with anti supply voltage variation and/or process variation will be readily apparent to one skilled in the art to which the invention pertains from a perusal of the claims, the appended drawings, and the following detailed description of the preferred embodiments.

To achieve the objective, as described by the description of embodiments, the disclosed voltage controlled oscillator with anti supply voltage variation and/or process variation contains: an oscillation circuit for outputting an oscillatory signal; a current source coupled to the oscillation circuit to provide an input current to the oscillation circuit; and a variation compensating circuit coupled to the current source and the oscillation circuit to compensate for the power supply and process variations. The variation compensating circuit includes: a peak detector coupled to the oscillation circuit to generate a peak voltage in proportion with the amplitude of the oscillatory signal, a compensating voltage generator to generate a reference voltage according to the process variation for compensating the oscillation circuit under a process variation for same work conditions; a comparator for comparing the peak voltage with the reference voltage to generate a control voltage; and an amplifier whose positive input terminal is coupled to one terminal of the current source, whose negative input terminal receives a control voltage, and whose output terminal is coupled to the other terminal of the current source.

To achieve the objectives, the disclosed voltage controlled oscillator with anti process variation contains: an oscillation circuit for outputting an oscillatory signal; a current source coupled to the oscillation circuit to provide an input current to the oscillation circuit; and a variation compensating circuit coupled to the current source and the oscillation circuit to compensate for the process variation. The variation compensating circuit includes: a peak detector coupled to the oscillation circuit to generate a peak voltage in proportion with the amplitude of the oscillatory signal, a compensating voltage generator to generate a reference voltage according to the process variation for compensating the oscillation circuit under a process variation for same work conditions; and a comparator for comparing the peak voltage with the reference voltage to generate a control voltage to the current source.

According to the objectives and principles of the invention, the voltage controlled oscillator with anti supply voltage variation and/or process variation combines the amplitude control and common-mode voltage control in a single circuit to avoid interference between two circuits and increase the circuit stability.

According to the objectives and principles of the invention, the voltage controlled oscillator with anti supply voltage variation and/or process variation has the advantages of saving circuit area and power consumption.

According to the objectives and principles of the invention, the voltage controlled oscillator with anti supply voltage variation and/or process variation can operate in its optimized conditions under any process, temperature and voltage supply variation.

According to the objectives and principles of the invention, the voltage controlled oscillator with anti supply voltage variation and/or process variation has a simple circuit structure to effectively reduce the phase noise of the voltage controlled oscillator.

According to the objectives and principles of the invention, the voltage controlled oscillator with anti supply voltage variation and/or process variation has a phase noise in proportion with its frequency adjusting range. Therefore, the frequency adjusting range of the voltage controlled oscillator is controlled to be minimized to enhance its performance.

According to the objectives and principles of the invention, the voltage controlled oscillator with anti supply voltage variation and/or process variation has the advantage of a short settling time.

According to the objectives and principles of the invention, the voltage controlled oscillator with anti supply voltage variation and/or process variation has the advantages of high reliability and stability. The invention can effectively improve the production yield of radio frequency (RF) integrated circuits.

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

BRIEF DESCRIPTION OF THE DRAWINGS

The above and other objects, features and advantages of the invention will be more clearly understood from the following detailed description when taken in conjunction with the accompanying drawings, in which.

DETAILED DESCRIPTION OF THE INVENTION

Figure 1:
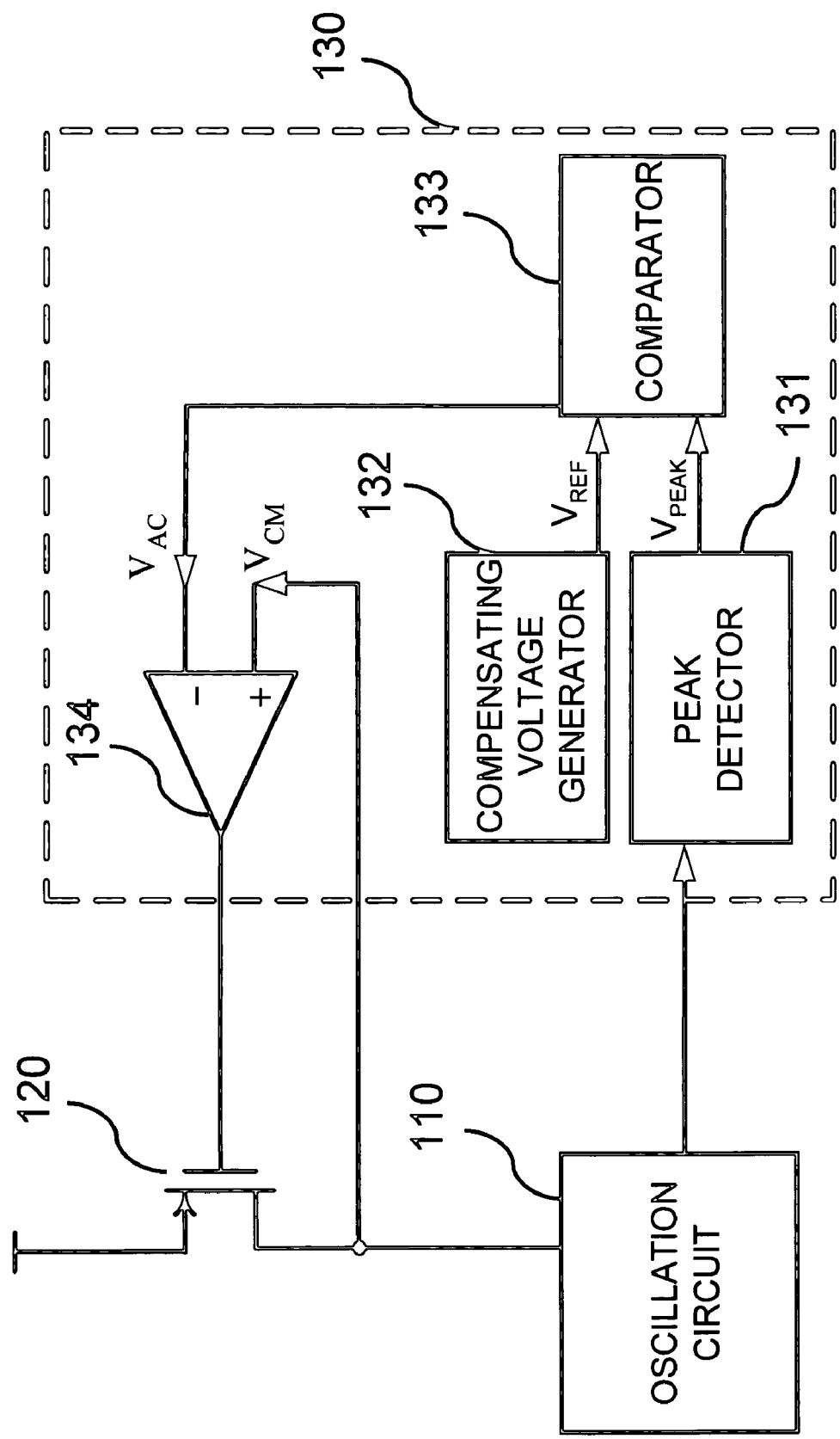
FIG. 1 is a circuit diagram of the disclosed voltage control oscillator with anti voltage supply and/or process variations.

Reference will now be made in greater detail to a preferred embodiment of the invention, an example of which is illustrated in the accompanying drawings. Wherever possible, the same reference numerals will be used throughout the drawings and the description to refer to the same or like parts. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

An embodiment of the disclosed voltage controlled oscillator with anti supply voltage variation and/or process variation is shown in FIG. 1, where only those basic elements for achieving the objectives of the invention are shown. Other possible modifications can be made according to practical needs.

In this embodiment, the invention has the ability of anti voltage supply and process variations. The voltage controlled oscillator consists of an oscillation circuit 110, a current source 120, and a variation compensating circuit 130. The composition and operation of each element are described as follows.

The oscillation circuit 110 outputs an oscillatory signal, whose frequency is controlled by a voltage. The oscillation circuit 110 is a voltage controlled oscillation circuit. Its composition is apparent to a person skilled in the art and will not be described herein.

The current source 120 is coupled to the oscillation circuit 110 to provide it with a current. In an embodiment of the invention, the current source 120 is a metal oxide semiconductor (MOS) transistor. In another embodiment, it can be a P-channel MOS transistor. In yet another embodiment, it is an N-channel MOS transistor. In a further embodiment, the current source 120 is a bipolar transistor. In a particular embodiment, it is an NPN bipolar transistor. In another particular embodiment, it is a PNP bipolar transistor.

The variation compensation circuit 130 is coupled to both the oscillation circuit 110 and the current source 120 to compensate for the voltage supply and process variations. The variation compensation circuit 130 consists of a peak detector 131, a compensating voltage generator 132, a comparator 133, and an amplifier 134.

The peak detector 131 is coupled to the oscillation circuit 110 to receive its oscillatory signal and filter it for obtaining a DC-like voltage signal. This DC-like voltage signal is used to generate a peak voltage Vpeak proportional to the amplitude of the oscillatory signal.

The compensating voltage generator 132 is used to generate a reference voltage Vref (or called the process variation compensating voltage) according to the process variation, compensating the oscillation circuit to obtain the same working conditions under the process variation. For example, the compensating voltage generator 132 is a process variation compensating voltage generator that generates different voltages according to the process variation. The active elements of the oscillation circuit 110 under the process variation can be compensated to obtain the same working conditions using different bias conditions.

The comparator 133 compares the peak voltage Vpeak with the reference voltage Vref to generate a control voltage $V_{AC}$. The amplifier 134, for example, can be a trans-impedance amplifier, whose positive input terminal is coupled to one terminal of the current source 110, whose negative input terminal receives the control voltage, and whose output terminal is coupled to the other terminal of the current source 110. It is further coupled to the common-mode terminal of the oscillation circuit 110 to form an amplitude and common-mode voltage control circuit.

In this embodiment, the voltage variation produced by the process and voltage supply variations is computed using the comparator and the amplifier. The result is fed back to the current source 120 so that the current source 120 can adjust according to the actual conditions of the circuit at all times. The oscillation circuit 110 thus always works under optimal setting conditions.

Figure 2:
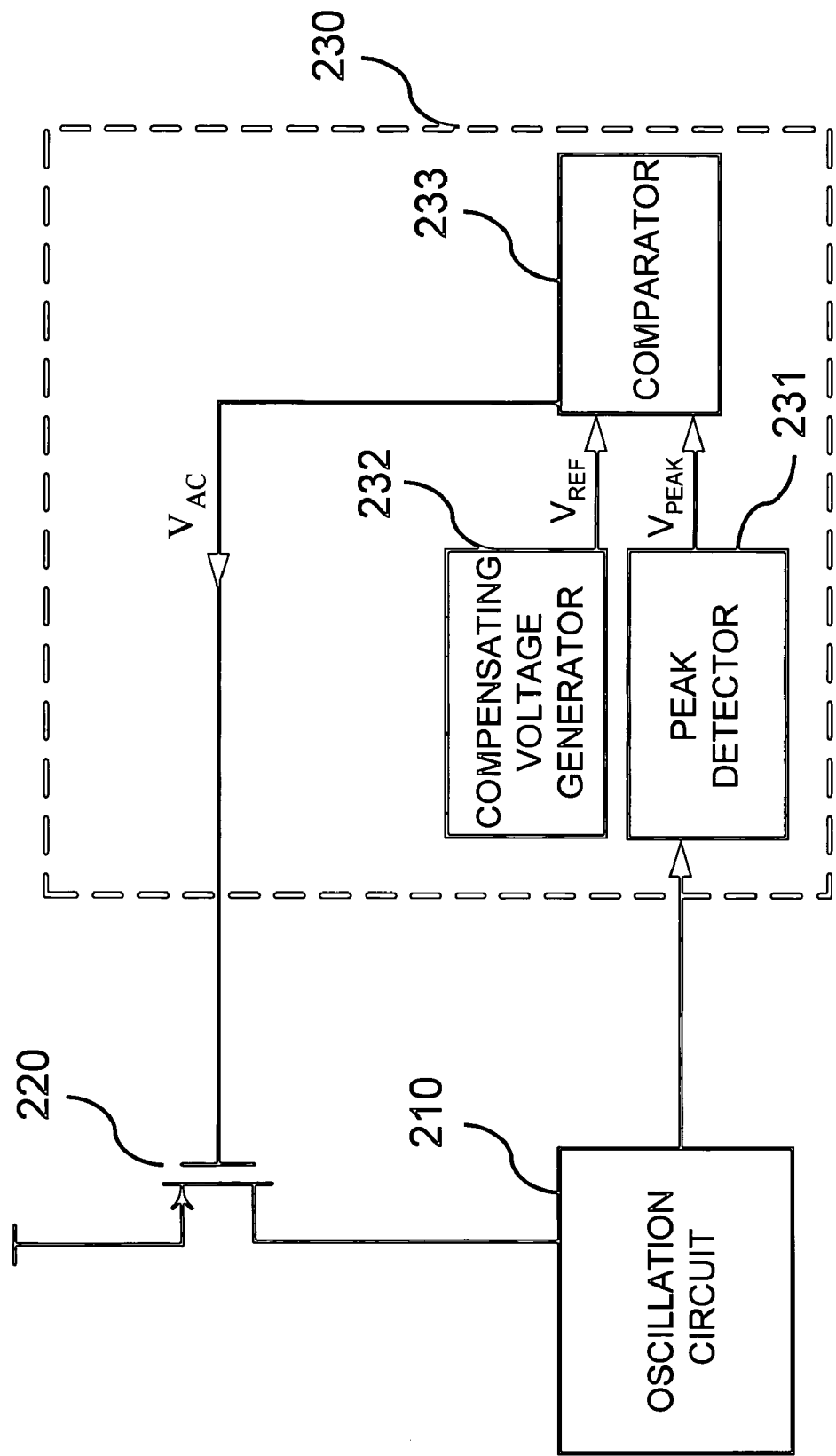
FIG. 2 is a circuit diagram of the disclosed voltage control oscillator with anti process variation.

Now referring to FIG. 2, another embodiment of the disclosed voltage controlled oscillator with anti supply voltage and process variations has the ability to resist process variation.

The voltage controlled oscillator consists of an oscillation circuit 210, a current source 220, and a variation compensation circuit 230. The composition and operation of each element are described as follows.

The oscillation circuit 210 outputs an oscillatory signal, whose frequency is controlled by a voltage. The oscillation circuit 210 is a voltage controlled oscillation circuit, whose composition is well-known to those skilled in the art. Therefore, we do not describe it in further detail here.

The current source 220 is coupled to the oscillation circuit 210 to provide it with a current. In an embodiment of the invention, the current source 220 is a metal oxide semiconductor (MOS) transistor. In another embodiment, it can be a P-channel MOS transistor. In yet another embodiment, it is an N-channel MOS transistor. In a further embodiment, the current source 220 is a bipolar transistor. In a particular embodiment, it is an NPN bipolar transistor. In another particular embodiment, it is a PNP bipolar transistor.

The variation compensation circuit 230 is coupled to both the oscillation circuit 210 and the current source 220 to compensate for the voltage supply and process variations. The variation compensation circuit 230 consists of a peak detector 231, a compensating voltage generator 232, and a comparator 233.

The peak detector 231 is coupled to the oscillation circuit 210 to receive its oscillatory signal and filter it for obtaining a DC-like voltage signal. This DC-like voltage signal is used to generate a peak voltage Vpeak proportional to the amplitude of the oscillatory signal.

The compensating voltage generator 232 is used to generate a reference voltage Vref (or called the process variation compensating voltage) according to the process variation, compensating the oscillation circuit to obtain the same working conditions under the process variation. For example, the compensating voltage generator 232 is a process variation compensating voltage generator that generates different voltages according to the process variation. The active elements of the oscillation circuit 210 under the process variation can be compensated to obtain the same working conditions using different bias conditions.

The comparator 233 compares the peak voltage Vpeak with the reference voltage Vref to generate a control voltage $V_{AC}$.

In this embodiment, the voltage variation produced by the process and voltage supply variations is computed using the comparator and the amplifier. The result is fed back to the current source 220 so that the current source 220 can adjust according to the actual conditions of the circuit at all times. The oscillation circuit 210 thus always works under optimal setting conditions.

The common-mode voltage control circuit and amplitude control circuit of the control circuit in the disclosed voltage controlled oscillator with anti voltage supply and process variations use the current source of the voltage controlled oscillator to form control circuits. The current signal generated by the comparator in the amplitude control circuit goes through a current-to-voltage circuit to convert the voltage signal into the reference voltage in the common-mode voltage control circuit, thereby achieving the objective of amplitude control.

The disclosed voltage controlled oscillator with anti voltage supply and process variations integrate the amplitude control circuit and the common-mode voltage control circuit into a single circuit to avoid interference between the two circuits and enhance the circuit stability.

The disclosed voltage controlled oscillator has the advantages of a simple structure, high reliability, being resistant to process and temperature variations, an economic circuit area, and low power consumption.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A voltage controlled oscillator with compensation for voltage supply, temperature, and processing variations, comprising:
    an oscillation circuit, which outputs an oscillatory signal;
    a current source, which is coupled to the oscillation circuit at a node to provide an input current to the oscillation circuit; and
    a variation compensation circuit, which is coupled to both the oscillation circuit and the current source to compensate for the variations and which comprises:
        a peak detector, which is coupled to the oscillation circuit to generate a peak voltage proportional to the amplitude of the oscillatory signal;
        a compensating voltage generator, which generates a reference voltage according to the variations for compensating the oscillation circuit;
        a comparator, which compares the peak voltage with the reference voltage to generate a control voltage; and
        an amplifier, having a first input terminal that is coupled to the node, a second input terminal that receives the control voltage, and an output terminal that is coupled to a control terminal of the current source.

2. The voltage controlled oscillator of claim 1, wherein the frequency of the oscillatory signal is controlled by a voltage.

3. The voltage controlled oscillator of claim 1, wherein the amplifier comprises a trans-impedance amplifier.

4. The voltage controlled oscillator of claim 1, wherein the current source comprises a metal oxide semiconductor (MOS) transistor.

5. The voltage controlled oscillator of claim 4, wherein the MOS transistor is selected from a P-channel MOS transistor and an N-channel MOS transistor.

6. The voltage controlled oscillator of claim 1, wherein the current source comprises a bipolar transistor.

7. The voltage controlled oscillator of claim 6, wherein the bipolar transistor is selected from an NPN bipolar transistor and a PNP bipolar transistor.

8. The voltage controlled oscillator of claim 1, wherein the first input terminal of the amplifier is a positive input terminal and the second input terminal of the amplifier is a negative input terminal.

* * * * *